(12) United States Patent
Ko et al.

(10) Patent No.: US 7,153,362 B2
(45) Date of Patent: Dec. 26, 2006

(54) SYSTEM AND METHOD FOR REAL TIME DEPOSITION PROCESS CONTROL BASED ON RESULTING PRODUCT DETECTION

(75) Inventors: Chang-Hyun Ko, Seoul (KR); Jai-Dong Lee, Yongin (KR); Jin-Hee Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 24 days.

(21) Appl. No.: 10/134,434

(22) Filed: Apr. 30, 2002

(65) Prior Publication Data

US 2003/0200924 A1 Oct. 30, 2003

(51) Int. Cl.
*C30B 23/00* (2006.01)

(52) U.S. Cl. .......................... 117/86; 118/719; 118/728; 118/733; 118/729

(58) Field of Classification Search .............. 156/345, 156/715; 118/715, 719, 728, 733, 729
See application file for complete search history.

(56) References Cited

U.S. PATENT DOCUMENTS

| | | | | |
|---|---|---|---|---|
| 4,454,835 A | * | 6/1984 | Walsh | ......................... 118/712 |
| 5,123,375 A | * | 6/1992 | Hansen | ........................ 118/715 |
| 5,326,975 A | * | 7/1994 | Barna | .......................... 250/372 |
| 5,443,647 A | * | 8/1995 | Aucoin et al. | ....... 118/723 ME |
| 5,544,618 A | * | 8/1996 | Stall et al. | ................... 117/102 |
| 6,146,492 A | * | 11/2000 | Cho et al. | .................... 156/345 |
| 6,210,745 B1 | | 4/2001 | Gaughan et al. | ............... 427/8 |
| 6,387,823 B1 | * | 5/2002 | Sonderman et al. | ........ 438/758 |
| 2001/0050146 A1 | * | 12/2001 | Shimeno et al. | ............ 156/345 |

FOREIGN PATENT DOCUMENTS

| | | | |
|---|---|---|---|
| EP | 0670590 A2 | * | 2/1995 |
| EP | 0670590 A2 | * | 6/1995 |
| WO | WO 009960272 A1 | * | 11/1999 |

* cited by examiner

*Primary Examiner*—Robert Kunenmund
*Assistant Examiner*—G. Nagesh Rao
(74) *Attorney, Agent, or Firm*—Harness, Dickey & Pierce, P.L.C.

(57) ABSTRACT

A system and method for real time deposition process control based on resulting product detection, where the system and method detect an amount of at least one reaction product in real time, while the deposition process is being performed, the detected amount of reaction product is compared with a reference amount, and a comparison result is fed back in real time to adjust a supply of one or more reactants. The system and method provide real time control over the deposition process and/or reduce the number of wafers produced that do not meet processing target values.

14 Claims, 3 Drawing Sheets

SYSTEM AND METHOD FOR REAL TIME DEPOSITION PROCESS CONTROL BASED ON RESULTING PRODUCT DETECTION

BACKGROUND OF THE INVENTION

1. Field of the Invention

The present invention relates to a system and method for real time deposition process control, where the control is based on a detection of resulting products, and more particularly, to a system and method for real time deposition process control based on resulting product detection, where the deposition process is an atomic layer deposition (ALD) process or a chemical vapor deposition (CVD) process.

2. Description of the Related Art

FIG. 1 is a schematic diagram of a conventional method for controlling a deposition process, disclosed in U.S. Pat. No. 6,210,745. As illustrated, FIG. 1, includes a deposition chamber 150 for performing a chemical vapor deposition (CVD) process on a wafer 156. A residual gas analyzer (RGA) 152, for analyzing gases by ionizing gas molecules and separating ions by mass, is mounted on the deposition chamber 150. The RGA 152 analyzes the resulting gases during the CVD process performed on the wafer 156 to acquire RGA data associated with processing parameters of the CVD process.

Subsequently, the wafer 156, having undergone the CVD process, is unloaded from the deposition chamber 150 and is then transferred to a measurement chamber 154 for measuring the thickness or other electrical properties of a thin film deposited on the wafer 156. If the measured values are different from processing target values, various processing parameters of the CVD process are adjusted.

Using the conventional technology described in U.S. Pat. No. 6,210,745, produced wafers 156 that do not satisfy the processing target values (within a given tolerance) cannot be reworked. Further, if the measurement time for the sample wafers is increased, all the following wafers on which the process is performed for a given time also will not satisfy the processing target values. As a result, many wafers are produced, which are not usable.

SUMMARY OF THE INVENTION

The present invention is intended to solve one or more of the above-described problems by providing a system and method for real time deposition process control based on resulting product detection, where the system and method detect an amount of at least one reaction product in real time, while the deposition process is being performed, the detected amount of reaction product is compared with a reference amount, and a comparison result is fed back in real time to adjust a supply of one or more reactants. The system and method of the present invention provide real time control over the deposition process and/or reduce the number of wafers produced that do not meet processing target values.

The above advantage is accomplished in one exemplary embodiment, by providing a real time control system comprising a reaction chamber in which a deposition process is performed on a wafer, a reactant supply for supplying at least one reactant into the reaction chamber, a detector, detecting an amount of at least one reaction product in real time, while the deposition process is performed in the reaction chamber, and a controller for comparing the amount of the at least one reaction product detected by the detector with a reference amount and feeding back a comparison result to the reactant supply in real time to adjust a supply of the at least one reactant.

The above advantage is also accomplished in one exemplary embodiment, by providing a real time control method for a deposition process, comprising supplying at least one reactant into a reaction chamber where the deposition process is performed, detecting an amount of at least one reaction product in real time, while the deposition process is performed in the reaction chamber, and comparing the amount of the at least one reaction product detected with a reference amount to obtain a comparison result and adjusting a supply of the at least one reactant in real time in accordance with the comparison result.

The deposition process can be applied to such exemplary processes as an atomic layer deposition (ALD) process and a chemical vapor deposition (CVD) process.

The controller may control the supply or non-supply of the reaction product by the amount of the resulting product monitored by the detector. Also, the controller may control the supply amount of the reaction product by the amount of the resulting product monitored by the detector.

According to another aspect of the present invention, there is provided a real time controlling method of a chemical vapor deposition process, the method including the steps of loading a wafer where a deposition process is performed, into a reaction chamber, supplying reaction gases into the reaction chamber from a reaction gas supplying portion and performing a chemical vapor deposition process on the wafer, real time monitoring the amount of the resulting gas generated during the chemical vapor deposition process, comparing the amount of the resulting gas real time monitored with a reference amount, feeding back the comparison result to the reaction gas supplying portion, and controlling the supply of the reaction gas and the deposition time in a CVD process in real time.

Alternatively, the present invention provides a real time controlling method of an atomic layer deposition process, the method including the steps of loading a wafer where a deposition process is performed, into a reaction chamber, supply of a first reaction gas into the reaction chamber and allowing the first reaction gas to be adsorbed into the wafer, stopping supplying the first reaction gas, purging the excess of the first reaction gas and exhausting the purged first reaction gas from the reaction chamber, supplying a second reaction gas into the reaction chamber and depositing a resulting gas generated by the reaction between the first and second reaction gases on the wafer, stopping supply of the second reaction gas, purging the resulting gas and exhausting the purged resulting gas from the reaction chamber, real time monitoring the amount of the resulting gas generated during the atomic layer deposition process, comparing the amount of the resulting gas real time monitored with a reference amount, feeding back the comparison result to a supplying portion of the first reaction gas, and controlling the supply of the first reaction gas and the process cycle in an ALD process in real time.

A cycle consisting of the steps of adsorbing the first reaction gas and exhausting the resulting gas is preferably repeated one or more times.

In one or more embodiment of the present invention, the controller preferably controls the supply or non-supply of at least one reaction product depending on an amount of at least one resulting product, monitored by the detector.

According to one or more embodiments of the present invention, since the resulting gases generated during the CVD process or ALD process are monitored in real time by the detector and a monitoring result is compared with a reference amount which is fed back, the thicknesses or other electrical properties of thin films deposited by the selected deposition process can be controlled on a real time basis.

BRIEF DESCRIPTION OF THE DRAWINGS

The present invention will become more apparent by describing in detail preferred embodiments thereof with reference to the attached drawings in which.

DETAILED DESCRIPTION OF THE INVENTION

Several embodiments of the present invention will now be described in more detail with reference to the accompanying drawings. However, the present invention is not limited to the following embodiments and is embodied in various forms. Rather, these embodiments are provided only so that this disclosure will be thorough and complete, and will fully convey the scope of the invention to those who have ordinary skill in the art.

Figure 1:
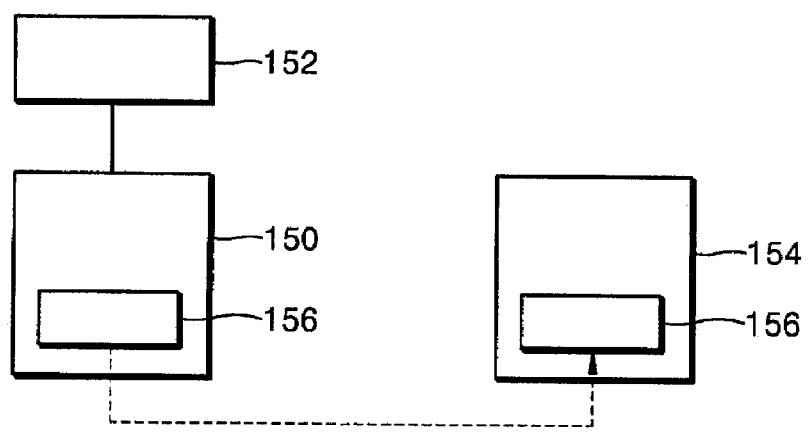
FIG. 1 is a schematic diagram of a conventional method for controlling a deposition process.
Figure 2:
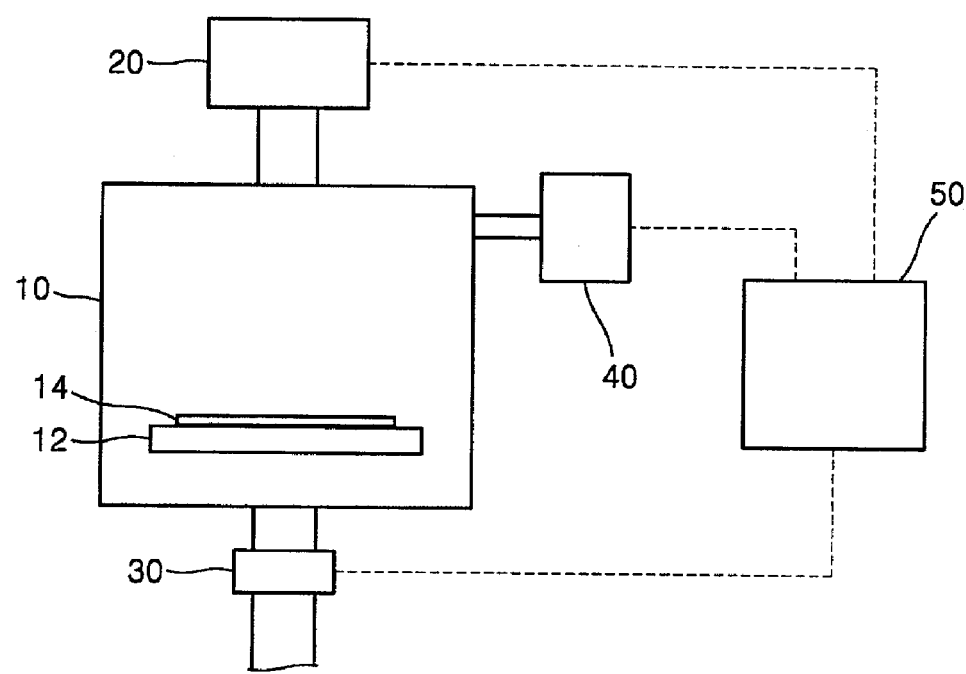
FIG. 2 is a schematic diagram of a real time control system according to an embodiment of the present invention.

FIG. 2 is a schematic diagram of a real time control system according to an embodiment of the present invention.

Referring to FIG. 2, a wafer 14 on which a deposition process is to be performed, is mounted on a stage 12 in a deposition chamber 10. A reaction or processing gas supplying portion 20 for supplying reaction or processing gases to the deposition chamber 10 is connected to the deposition chamber 10. A vacuum pump 30 for maintaining the deposition chamber 10 vacuum is connected to the deposition chamber 10 (in a preferred embodiment, the lower part of the deposition chamber 10) as illustrated in FIG. 2.

Also, a detector 40 for real time detection of the resulting gases generated by the reaction of the reaction or processing gases, while the deposition process is performed, is mounted in or on the deposition chamber 10. A controller 50 is connected to the detector 40, and compares the amount of the resulting gases monitored by the detector 40 with a reference amount (for example from a correlation table, such as those used in U.S. Pat. No. 6,210,745) on a real time basis to then feed back the comparison result to the reaction or processing gas supplying portion 20 and/or the vacuum pump 30. In one embodiment, a quadruple mass spectroscopy (QMS) is employed as the detector 40, however, other types of residual gas analyzers (RGAs) may also be used including an infrared (IR), inductively coupled plasma (ICP), time of flight (TO F) mass spectrometer, or ultraviolet (UV) detection system.

RGAs can measure levels over a wide range of pressures. RGAs identify the gases present in vacuum environments by producing a beam of ions from samples of the gas, separating the resulting mixture of ions according to their charge-to-mass ratios, and providing as output signal which is a measure of the relative species present. RGAs differ from other mass spectrometers by their high sensitivity and their ability to withstand baking so that gases from the RGA can be desorbed. This allows gases of low partial pressure to be identified without being obscured by contributions from the analyzer itself.

Although numerous techniques have been developed for mass separation, the rf quadrupole is the most popular design for use in RGAs. The quadrupole includes four cylindrical rods, to which is applied a combination of dc and ac potentials. For a given applied frequency, only ions of a particular mass-to-charge ratio pass through to the collector. Since they do not require a magnetic field, quadrupoles are much less bulky than magnetic mass analyzers allowing them to be mounted directly onto vacuum systems.

The RGA may be connected to the vacuum chamber with a valve that will permit monitoring the background when the system is evacuated to the high-vacuum range. It may also be connected to a parallel leak valve for use when the chamber is being operated at higher (e.g., sputter) pressures. RGAs are essentially specified by the following characteristic properties:

1. Peak Width—measured in atomic mass units (amu) is specified for at least two positions of the peak—for 50% and 10% of the peak height. The peak width is characteristic of the mass resolution of the RGA.
2. Mass Range—specifies the lightest and heaviest singly charged ions that can be detected.
3. Smallest Detectible Partial Pressure—is the partial pressure that causes a collected current greater than the system noise amplitude.
4. Linear Range—is the pressure region over which the sensitivity between the given limits (e.g., ±10%) remains constant.
6. Sensitivity—is the quotient of the ion current at the collector and partial pressure of the gas present in the ion source.
7. Scan Rate—is the speed at which the RGA sweeps the ion beams of all masses in a given mass range across the collector and records the resulting spectrum.

Figure 3:
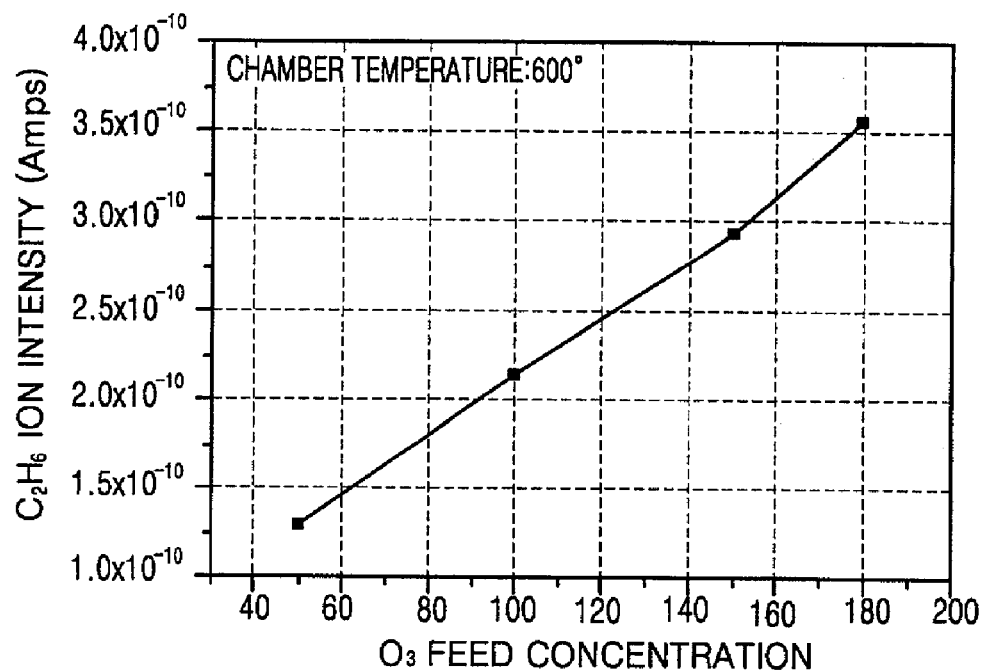
FIG. 3 is a graph showing the relationship between the feeding concentration of ozone and the intensity of ethane generated in an atomic layer deposition process according to an embodiment of the present invention.

Although generally shown in FIG. 2, the real time control system can be applied to ALD and CVD processes, among others. FIG. 3 is a graph showing an exemplary relationship between the feeding concentration of ozone and the intensity of ethane generated in an atomic layer deposition process according to one embodiment of the present invention. When performing an ALD process on alumina ($Al_2O_3$) using trimethylaluminum (TMA, Al $(CH_3)_3$) and ozone ($O_3$), the following reaction occurs:

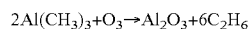

$$2Al(CH_3)_3 + O_3 \rightarrow Al_2O_3 + 6C_2H_6$$

The thickness of an alumina film deposited on the wafer in units of atoms based on the above reaction is proportional to the amount of ethane $C_2H_6$, that is, a resulting gas. Thus, the thickness of the alumina film can be monitored in real time by the amount of ethane generated after reaction.

It can be ascertained from FIG. 3 that the intensity of ethane measured by QMS proportionally increases as an ozone feeding concentration increases. Based on the measurement result, the controller (50 of FIG. 2) can determine whether the reaction or processing gases of the reaction or processing gas supplying portion 20 are to be supplied or not, by real time monitoring the intensity of ethane resulting from the ALD process performed on alumina.

Figure 4:
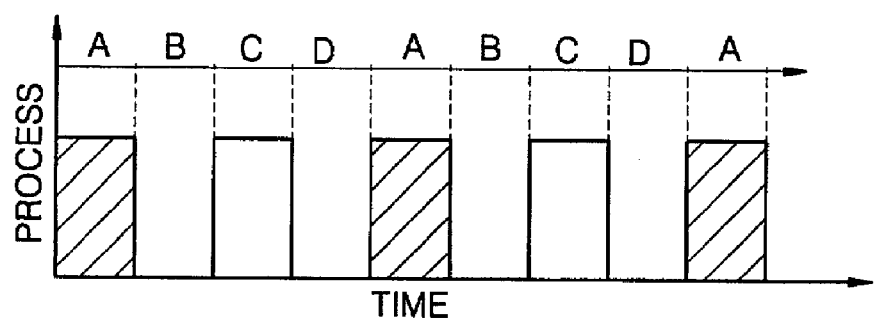
FIG. 4 is a timing chart of the atomic layer deposition process according to an embodiment of the present invention.

FIG. 4 is a time chart of the ALD process according to one embodiment of the present invention.

Figure 5:
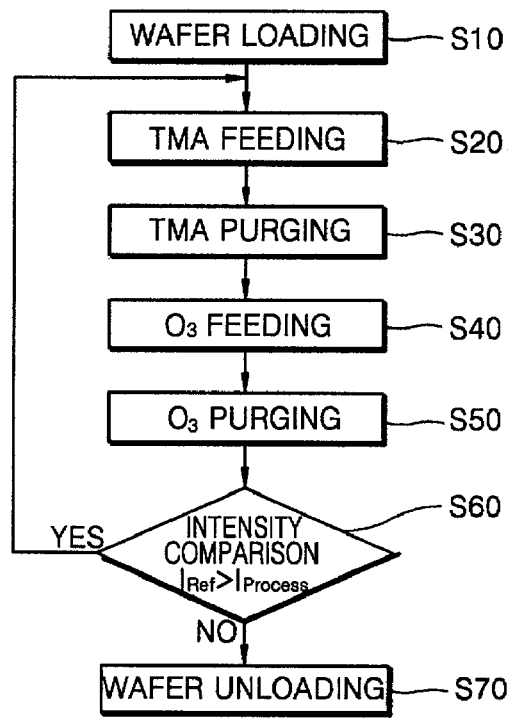
FIG. 5 is a flow chart of the atomic layer deposition process according to an embodiment of the present invention.

Referring to FIGS. 2, 4 and 5, a process of real time controlling the ALD process according to one embodiment of the present invention will now be described.

First, the wafer 14 is loaded into the deposition chamber 10 maintained at a constant vacuum degree by the vacuum pump 30 (step S10). Then, the first reaction or processing gas, i.e., a TMA gas, is fed into the deposition chamber 10 from the reaction or processing gas supplying portion 20 so that TMA gas molecules are adsorbed onto the surface of the wafer 14 (step S20; a portion "A" shown in FIG. 4). Next, the supply of TMA gas molecules is stopped and then an inert gas or a noble gas, e.g., nitrogen gas, is fed as a purge gas into the deposition chamber 10. Excessive TMA gas molecules that are not adsorbed or unstably physically adsorbed onto the surface of the wafer 14 are removed from the deposition chamber 10 (step S30, a portion "B" shown in FIG. 4).

Subsequently, the second reaction gas, i.e., ozone gas, is fed into the deposition chamber 10 from the reaction or processing gas supplying portion 20 to allow the ozone gas as the second reaction gas to react with the TMA gas molecules as the first reaction gas, thereby forming an alumina layer of a single atomic layer on the wafer 14 (step S40; a portion "C" shown in FIG. 4). Then, the supply of the ozone gas is stopped and a purge gas is supplied to allow unreacted ozone gas or resulting ethane to be purged and removed from the deposition chamber 10 (step S50; a portion "D" shown in FIG. 4).

The ALD process is generally repeatedly performed in a period of cycles each consisting of the steps S10, S20, S30, S40, S50, and S60. A single alumina layer is formed on the wafer 14 during one cycle.

After the wafer 14 is loaded into the deposition chamber 14 (step S10), the intensity of ethane, which is a resulting gas, is real time monitored by the detector 40 connected to the deposition chamber 10.

The intensity of ethane monitored during the process (to be abbreviated as $I_{process}$) is real time compared with a reference intensity ($I_{ref}$) (step S60). If $I_{process}$ is smaller than $I_{ref}$, a new cycle of the ALD process is again performed, that is, TMA is fed again (step S20). However, if $I_{process}$ is greater than or equal to $I_{ref}$, the cycle of the ALD process is stopped and the wafer 14 is unloaded from the deposition chamber 10 (step S70).

Figure 6:
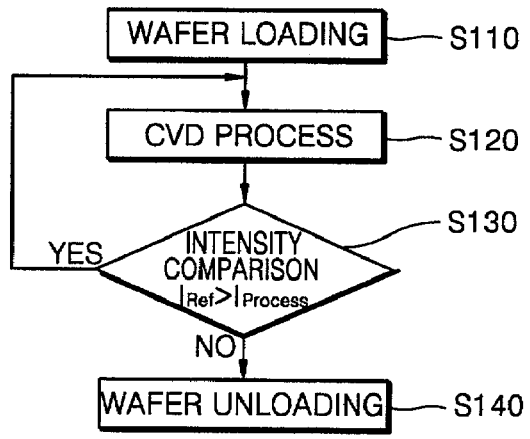
FIG. 6 is a flow chart of a chemical vapor deposition process according to an embodiment of the present invention.

FIG. 6 is a flow chart of a chemical vapor deposition (CVD) process according to one embodiment of the present invention.

Referring to FIGS. 2 and 6, a process of real time controlling the CVD process according to one embodiment of the present invention will now be described. In this embodiment, a silicon nitride layer is subjected to the CVD process using ammonia ($NH_3$) and dichlorosilane (DCS ($SiH_2Cl_2$) as processing gases, and the chemical reaction is as follows:

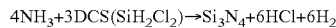

$4NH_3 + 3DCS(SiH_2Cl_2) \rightarrow Si_3N_4 + 6HCl + 6H_2$

First, the wafer 14 is loaded into the deposition chamber 10 maintained at a constant or substantially constant vacuum by the vacuum pump 30 (step S110). Then, ammonia ($NH_3$) and dichlorosilane (DCS ($SiH_2Cl_2$) as processing gases of a CVD process for a silicon nitride layer are fed into the deposition chamber 10 from the reaction or processing gas supplying portion 20 to perform the CVD process (step S120).

After the wafer 14 is loaded into the deposition chamber 14 (step S110), the intensities of hydrogen chloride (HCl) and hydrogen ($H_2$), which are resulting gases, are real time monitored by the detector 40 connected to the deposition chamber 10.

The intensity $I_{process}$ of hydrogen chloride or hydrogen monitored during the process is real time compared with a reference intensity $I_{ref}$ (step S130). If $I_{process}$ is smaller than $I_{ref}$, the processing parameters of the CVD process, e.g., the amount of processing gases, the processing time or the processing pressure, are adjusted on a real time basis. However, if $I_{process}$ is greater than or equal to $I_{ref}$, the CVD process is stopped without adjusting the processing parameters and the wafer 14 is unloaded from the deposition chamber 10 (step S140).

According to the present invention, resulting gases generated while an ALD process or CVD process is performed in a deposition chamber, are real time monitored and the monitoring result is real time compared with a reference. Thus, determination of continuous performance of the deposition process or adjustment of processing parameters is fed back in real time, thereby more accurately controlling the deposition process and reducing processing inferiority, leading to improvement in manufacturability.

Although the present invention has been described above in conjunction with numerous embodiments, these embodiments may be varied as would be known to one of ordinary skill in the art. For example, although the reaction, processing and resulting materials are described as gases, these materials could also be any combination of gases, liquids and if possible, solids. Further, although the system and method are described as performing the functions of monitoring and controlling, only one of these functions could also be performed. Still further although the exemplary chemistry describes reactions producing $Al_2O_3$ and $Si_3N_4$, reactions producing $TiO_2$, $Ta_2O_5$ and other materials are also considered within the scope of the present invention. Still further, although an amount of resulting gas is detected, any other useful parameter could also be utilized for detection. For a CVD process, these parameters may include a portion of a reactant gas, a quantity of a reactant gas, and a deposition time, among others known to one of ordinary skill in the art. For an ALD process, these parameters may include a portion of a reactant gas, a quantity of a reactant gas, and a total process cycle, among others known to one of ordinary skill in the art. Still further, although the system and method are described as performing deposition, the techniques of the present invention could also be applied to other processes, such as end point detection or other etching processes.

What is claimed is:

1. A real time control system, comprising:
   a reaction chamber in which a deposition process is performed on a wafer;
   a reaction gas supply for supplying at least one reaction gas into the reaction chamber;
   a detector, detecting at least one resulting gas, the detector capable of real time monitoring an amount of the at least one resulting gas generated while the deposition process is performed in the reaction chamber;
   a controller, connected to the detector, for comparing the amount of the at least one reaction gas detected by the detector with a reference amount and feeding back a comparison result to the reaction gas supply in real time to adjust a supply of the at least one reaction gas; and a vacuum pump, connected to the controller, for maintaining a vacuum of said reaction chamber, the vacuum pump adjusting the supply of vacuum in real time based on the comparison result.

2. The real time control system according to claim 1, wherein the deposition process is an atomic layer deposition process.

3. The real time control system according to claim 1, wherein the deposition process is a chemical vapor deposition process.

4. The real time control system according to claim 1, wherein the detector is a residual gas analyzer.

5. The real time control system according to claim 1, wherein the detector is selected from the group consisting of a quadrapole mass spectrometer (QMS), an Infrared (IR) detection system, an inductively coupled plasma (ICP) detection system, time of flight (TOF) mass spectrometer, and an ultraviolet (UV) detection system.

6. The real time control system according to claim 1, wherein the controller controls a supply or non-supply of the at least one reaction gas depending on the amount of resulting gas detected by the detector.

7. The real time control system according to claim 1, wherein the controller controls a supply amount of the at least one reaction gas depending on the amount of the at least one resulting gas detected by the detector.

8. The real time control system according to claim 1, wherein the controller controls the total process cycles in an ALD process and deposition time in a CVD process depending on the amount of the resulting gas detected by the detector.

9. A real time control system, comprising:

a reaction chamber in which a deposition process is performed on a wafer;

a reactant supply for supplying at least one reactant into the reaction chamber;

a detector, detecting an amount of at least one reaction product in real time, while the deposition process is performed in the reaction chamber;

a controller, connected to the detector, for comparing the amount of the at least one reaction product detected by the detector with a reference amount and feeding back a comparison result to the reactant supply in real time to adjust a supply of the at least one reactant; and a vacuum pump, connected to the controller, for maintaining a vacuum of said reaction chamber, the vacuum pump adjusting the supply of vacuum in real time based on the comparison result.

10. The real time control system of claim 9, wherein the deposition process is an atomic layer deposition process.

11. The real time control system of claim 9, wherein the deposition process is a chemical vapor deposition process.

12. The real time control system of claim 9, wherein the deposition process forms a single atomic layer on the wafer.

13. The real time control system of claim 1, wherein the reference amount compared by the controller is included in a table.

14. The real time control system of claim 9, wherein the reference amount compared by the controller is included in a table.

* * * * *